United States Patent [19]

Kusaka et al.

[11] Patent Number: 4,728,822
[45] Date of Patent: Mar. 1, 1988

[54] DATA PROCESSING SYSTEM WITH IMPROVED OUTPUT FUNCTION

[75] Inventors: Yuko Kusaka; Keiji Matsumoto, both of Tokyo, Japan

[73] Assignee: NEC Corporation, Tokyo, Japan

[21] Appl. No.: 604,249

[22] Filed: Apr. 26, 1984

[30] Foreign Application Priority Data

Apr. 26, 1983 [JP] Japan ................................. 58-73279

[51] Int. Cl.⁴ ................ H03K 19/017; H03K 19/094; H03K 19/00; H01P 1/22
[52] U.S. Cl. .................................... 307/448; 307/451; 307/473; 307/540; 307/558
[58] Field of Search ............... 307/448, 451, 473, 478, 307/540, 557–558, 475, 474

[56] References Cited

U.S. PATENT DOCUMENTS

4,121,203 10/1978 Edwards et al. ..................... 307/448
4,217,502 8/1980 Suzuki et al. ....................... 307/475

Primary Examiner—John S. Heyman
Assistant Examiner—M. R. Wambach
Attorney, Agent, or Firm—Sughrue, Mion, Zinn, Macpeak, and Seas

[57] ABSTRACT

A data processing system having an improved output circuit which can set its output terminal optionally at a high impedance state and at a voltage clamped state in a standby mode. The system includes an output circuit capable of setting the output terminal at the high impedance state and the voltage clamped state in response to a first control signal and a second control signal, respectively.

13 Claims, 10 Drawing Figures

DATA PROCESSING SYSTEM WITH IMPROVED OUTPUT FUNCTION

Background of the Invention

The invention relates to data processing systems, and more specifically to the output circuits for data processing systems.

A large number of data processing systems operative with low power consumption have become available in recent years due to the development of CMOS technology. The demand for low power consumption systems has also led to including standby modes in data processing systems, wherein clock pulses normally applied to the functional circuitry of the data processing system are blocked or discontinued during periods when the data processor is not performing a functional operation, and the output terminal of the output circuit is clamped at the high binary level.

If the peripheral circuit to which the output terminal is connected is a CMOS circuit, i.e., one with a high input impedance, the clamped output level does not present problems. However, if the peripheral circuit is a low impedance input circuit, such as a TTL circuit, current flows into the peripheral circuit during standby causing undesired loss of power during standby mode.

Alternatively, setting the output terminal at a high impedance during standby will suffice if low impedance TTL circuits are connected as the peripheral circuits, but such a set high impedance will adversely affect any CMOS peripheral circuit.

In other words, it has been necessary to select the type of the utilizing circuit to be connected to the processing system in accordance with the type of the output circuit of the system, and this results in complexity in designing the system and poor flexibility, and high performance cannot be obtained.

SUMMARY OF THE INVENTION

It is one object of the present invention to provide a data processing system with an improved output circuit.

It is another object of the present invention to provide a data processing system which can be connected to any type of peripheral circuit.

The data processing system according to the present invention is of the type having a standby mode during which no functional processing is conducted, and comprises an output circuit whose output terminal can be set at optional one of a high impedance state and a clamped state when the system is in the standby mode.

The data processing system according to the present invention can interface with any kind of peripheral circuit by selecting its output state in the standby mode.

For example, by setting the output terminal of the output circuit of the system at the high-impedance state, the output terminal of the output circuit of the system can be connected to a peripheral circuit having a low input impedance without causing any trouble. Also, by clamping the output terminal of the output circuit at a predetermined level, the system can be connected to a peripheral circuit having a large input impedance, such as a CMOS type circuit, without causing malfunction of the peripheral circuit.

DETAILED DESCRIPTION OF THE PREFERRED EMBODIMENT

First, with reference to FIGS. 1 and 2, the problems due to the output circuit of the data processing system according to the prior art will be described.

Figure 1:
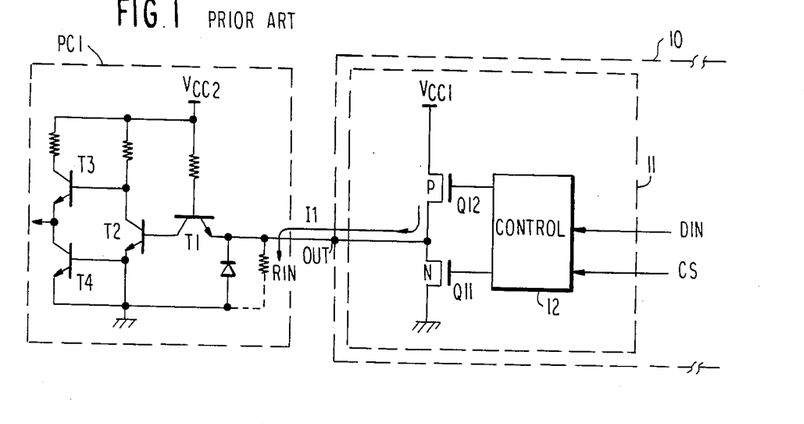
FIG. 1 is a circuit diagram showing one type of output circuit of a data processing system according to the prior art and a TTL circuit connected to the output circuit.

FIG. 1 shows an output circuit of the type which clamps the output at a predetermined level during standby mode connected to a TTL type peripheral circuit. The output circuit is indicated as 11, the TTL circuit is indicated as $PC_1$, and the numeral 10 generally designates the data processing circuit, of which the output circuit forms a part. The output circuit 11 includes a series circuit of an N-channel field effect transistor $Q_{11}$ and a P-channel field effect transistor $Q_{12}$ coupled in series between a power voltage terminal $V_{cc1}$ and a ground potential terminal. Field effect transistors $Q_{11}$ and $Q_{12}$ form a known CMOS type inverter circuit. A control circuit 12 receives a data signal DIN effect transistors the system and controls the field effect transistors $Q_{11}$ and $Q_{12}$ in the complementary manner in a normal operation mode. These two field effect transistors $Q_{11}$ and $Q_{12}$ are also controlled by a control signal CS generated within the data processing system. When the processing system is in a standby mode, i.e., does not perform any functional processing of data, the signal CS is activated. In this instance, the control circuit 12 makes the field effect transistor $Q_{11}$ non-conducting while the field effect transistor $Q_{12}$ is turned to the conducting state. Accordingly, the output terminal OUT is clamped at the potential of the power voltage $V_{cc1}$, i.e., the high level.

The peripheral input circuit $PC_1$ includes a TTL type input circuit whose input terminal is connected to the output terminal OUT of the data processing system 10. The TTL type input circuit includes an emitter-input type bipolar transistor $T_1$ and bipolar transistors $T_2$ to $T_4$ forming a buffer circuit. As is well known, the input impedance of the bipolar circuit is relatively low and can be represented by the equivalent circuit resistance $R_{IN}$.

Accordingly, when the data processing system 10 is in the standby mode and field effect transistor $Q_{12}$ is conducting, a current $I_1$ flows from the power voltage $V_{cc1}$ through the transistor $Q_{12}$ and the resistor $R_{IN}$ to ground potential. This current $I_1$ has no functional meaning in either the processing system 10 and the peripheral input circuit $PC_1$ and results in unnecessary power consumption.

Figure 2:
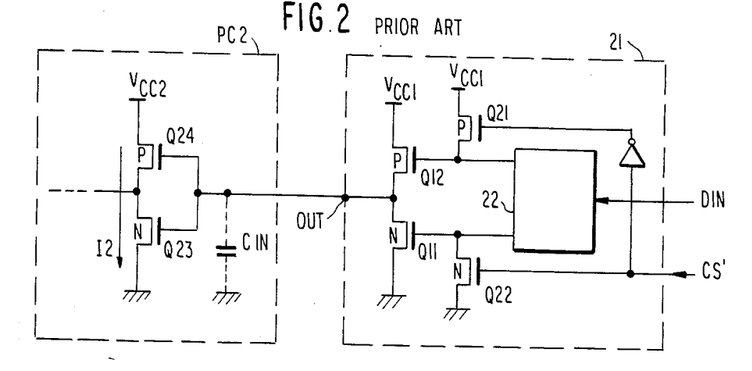
FIG. 2 is a circuit diagram showing a second type of output circuit of a data processing system according to the prior art and a CMOS circuit connected to the output circuit.

FIG. 2 shows an output circuit of the type which sets the output at a high impedance during standby mode connected to a CMOS type peripheral circuit. The output circuit is indicated by 21 and the CMOS peripheral circuit is indicated by $PC_2$. The output circuit 21 includes a P-channel field effect transistor $Q_{21}$ coupled between the gate of the field effect transistor $Q_{12}$ and the power voltage $V_{cc1}$, and an N-channel field effect transistor $Q_{22}$ coupled between the gate of the field effect transistor $Q_{11}$ and ground. When the data processing system including the output circuit 21 is in the standby mode, a control signal CS' generated within the system is at the high level so that both of the field effect transistors $Q_{21}$ and $Q_{22}$ are made conducting.

Accordingly, both of the field effect transistors $Q_{11}$ and $Q_{12}$ are made non-conducting thereby to set the output terminal at the high impedance state in the standby mode.

A peripheral circuit $PC_2$, connected to the output circuit 21, is of the CMOS type and includes a CMOS input inverter formed of an N-channel field effect transistor $Q_{23}$ and a P-channel field effect transistor $Q_{24}$. The gates of the transistors $Q_{23}$ and $Q_{24}$ are commonly connected to the output terminal OUT. As is well known, the input impedance of the CMOS type circuit is extremely high, and hence only a capacitive component $C_{IN}$ is present at the input terminal of the peripheral circuit $PC_2$. When the data processing system is in the standby mode, the circuit connection from the output terminal OUT of the output circuit 21 to the input terminal of the peripheral circuit $PC_2$ will be floating. Therefore, the output voltage level is very responsive to noise or the like, and it frequently takes an intermediate level of the power voltage $V_{cc1}$ and the ground potential. When the potential of the input terminal of the peripheral circuit $PC_2$ is at an intermediate level, both of the field effect transistors $Q_{23}$ and $Q_{24}$ are conducting, resulting in a current $I_2$ and unnecessary power consumption.

In addition, the logic level of the input terminal of the peripheral circuit $PC_2$ is not fixed in the standby mode and hence the logic state of the peripheral circuit $PC_2$ is affected by the level of the input terminal thereof, resulting in malfunction.

Figure 3:
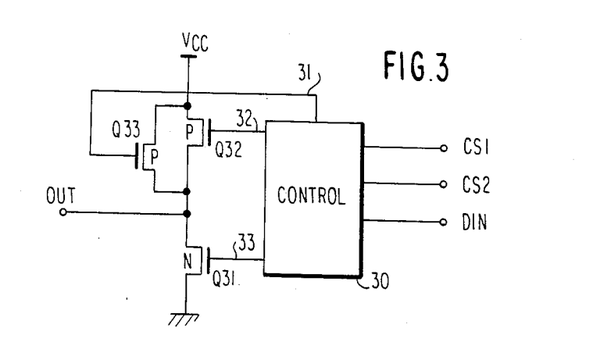
FIG. 3 is a diagram showing a basic structure of an output circuit in accordance with a preferred embodiment of the present invention.

A basic structure of the output circuit of the data processing system according to the present invention will be explained with reference to FIG. 3. An N-channel field effect transistor $Q_{31}$ and a P-channel field effect transistor $Q_{32}$ are connected in series between the power voltage terminal $V_{cc}$ and the ground potential terminal to form an output switching circuit. An output terminal OUT is connected to the common junction of the field effect transistors $Q_{31}$ and $Q_{32}$. A P-channel field effect transistor $Q_{33}$ is connected in parallel with the field effect transistor $Q_{32}$. The on-resistance of the field effect transistor $Q_{33}$ is selected to have a larer value than that of the field effect transistor $Q_{32}$ because the purpose of the field effect transistor $Q_{33}$ is to set the output terminal OUT in the standby mode. A control circuit 30 receives a data signal DIN, a first control signal $CS_1$ and a second control signal $CS_2$ which are generated within the data processing system.

When the operation is in a normal mode, both of the control signals $CS_1$ and $CS_2$ are inactive (in this case at the low level), and the control circuit 30 controls the operations of the field effect transistors $Q_{32}$ and $Q_{31}$ in the complementary manner in response only to the data signal DIN. In this instance, the field effect transistor $Q_{33}$ is kept non-conducting, or it is controlled together with the field effect transistor $Q_{32}$.

When the operation is in the standby mode, the output terminal OUT of the output circuit can assume either a high impedance state (Hi-Z) or a high level clamped state by the control signals $CS_1$ and $CS_2$.

When the control signal $CS_1$ is at the high level and control signal $CS_2$ is at the low level, output lines 31 and 32 of the control circuit 30 are at the high level, while the line 33 is at the low level. Therefore, the field effect transistors $Q_{31}$ to $Q_{33}$ are non-conducting so that the output terminal OUT is set at the high-impedance state.

When the control signal $CS_2$ is at the high level and control signal $CS_1$ at the low level, the lines 31 and 33 are at the low level and the line 32 is at the high level. Therefore, only the transistor $Q_{33}$ is made conducting so that the output terminal OUT is clamped at the high level in the standby mode.

Thus, the output terminal OUT can be set at the high-impedance state and the low impedance state in the standby mode.

Figure 4:
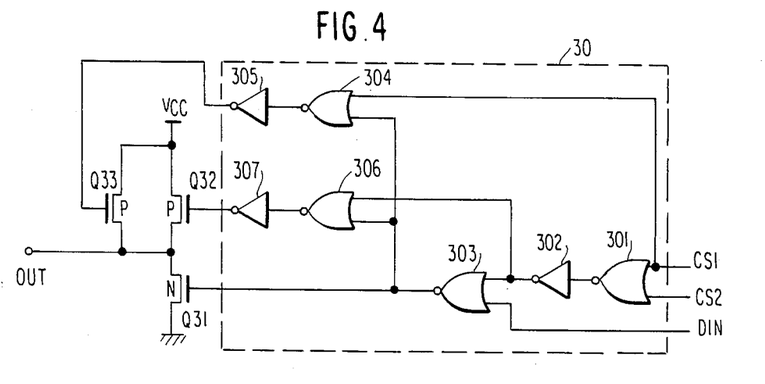
FIG. 4 illustrates in partial block diagram form some details of the circuit of FIG. 3.

With reference to FIG. 4, a practical example of the circuit of FIG. 3 will be explained.

The control circuit 30 includes two-input NOR circuits 301, 303, 304 and 306 and inverter circuits 302, 305 and 307. The control signal $CS_1$ is applied to one input terminal of the NOR circuit 301 and to one input terminal of the NOR circuit 304. The control signal $CS_2$ is applied to the other input terminal of the NOR circuit 301. The output of the NOR circuit 301 is applied to the input terminal of the inverter 302 whose output terminal is connected to one input terminal of the NOR circuit 303 and to one input terminal of the NOR circuit 306. The output terminal of the NOR circuit 303 is connected to the gate of the N-channel field effect transistor $Q_{31}$, to the other input terminal of the NOR circuit 306, and to the other input terminal of the NOR circuit 304. The output terminal of the NOR circuit 306 is connected to the input terminal of the inverter circuit 307 whose output is applied to the gate of the P-channel field effect transistor $Q_{32}$. The output of the NOR circuit 304 is inverted by the inverter 305 and the inverted signal therefrom is applied to the gate of the P-channel field effect transistor $Q_{33}$. The data signal DIN is applied to the other input terminal of the NOR circuit 303. The operations of this output circuit will be explained together with FIG. 6.

Figure 6A:
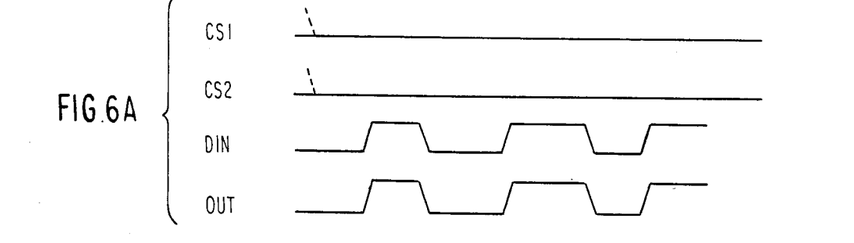
FIGS. 6A-6C are waveform diagrams showing various operations of the circuit shown in FIG. 4.

In this output circuit, when both of the signals $CS_1$ and $CS_2$ are at the low level, the system is in the normal operation mode. In this mode, the output of the NOR circuit 301 is at the high level and hence the output of the inverter 302 is at the low level. Therefore, the NOR circuit 303 produces the output signal in response to the data signal DIN, and the NOR circuit 306 produces the output signal which is the inverted signal of the output of the NOR circuit 303. Also, the NOR circuit 304 produces the output signal of the opposite phase to the output of the NOR circuit 303, and the cascade structure of the NOR circuit 304 and the inverter 305 operate in parallel with the cascade structure of the NOR circuit 306 and the inverter 307. Therefore, the P-channel field effect transistor $Q_{33}$ takes the same operational condition as the P-channel field effect transistor $Q_{32}$. The co-operation of the transistors $Q_{32}$ and $Q_{33}$ in the normal operation mode increases the effective drivability of the transistor $Q_{33}$ to improve switching speed when the output terminal OUT changes from the low level to the high level. Thus, in the normal operation mode, the N-channel field effect transistor $Q_{31}$ and the P-channel field effect transistors $Q_{32}$ and $Q_{33}$ are controlled by the data signal DIN. Namely, when the data signal DIN is at the high level, the output of the NOR circuit 303 is at the low level and the outputs of the inverters 305 and 307 are at the low level. Therefore, the transistor $Q_{31}$ is non-conducting while the transistors $Q_{32}$ and $Q_{33}$ are conducting to set the output terminal OUT at the high level as illustrated in FIG. 6(A). On the contrary, when the data signal DIN is at the low level, then the output of the NOR circuit 303 is at the high level and the outputs of the inverters 305 and 307 are at the high level. Therefore, the transistor $Q_{31}$ is conducting while the transistors $Q_{32}$ and $Q_{33}$ are non-conducting to set the output terminal OUT at the low level.

In the case of the standby mode, two output conditions of the output terminal OUT are possible as explained below.

Figure 6B:
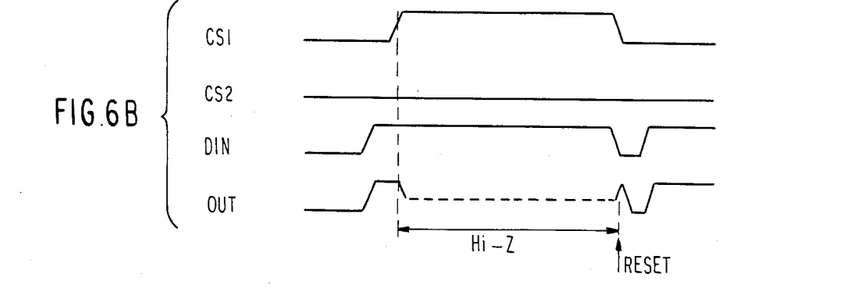

When the control signal $CS_1$ is at the high level and the control signal $CS_2$ is at the low level, the output of the NOR circuit 301 is at the low level and hence the output of the inverter 302 is at the high level. Therefore, the outputs of the NOR circuits 303 and 306 are at the low level, and the output of the inverter 307 is at the high level, irrespective of the level of DIN. The output of the NOR circuit 304 is at the low level and hence the output of the inverter 305 is at the high level. Thus, the gate potential of the transistor $Q_{31}$ is at the low level while the gate potentials of the transistors $Q_{32}$ and $Q_{33}$ are at the high level so that all of the transistors $Q_{31}$ to $Q_{33}$ are non-conducting to set the output terminal OUT at the high impedance state, as shown in FIG. 6(B).

Figure 6C:
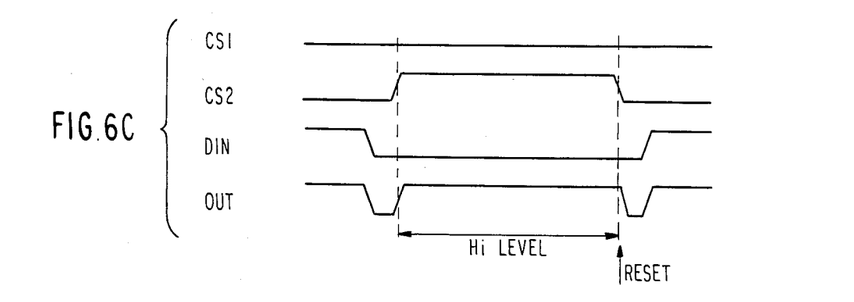

When the control signal $CS_1$ is at the low level and the control signal $CS_2$ is at the high level, the output of the NOR circuit 301 is at the low level and the output of the inverter 302 is at the high level. Therefore, the outputs of the NOR circuits 303 and 306 are at the low level and the output of the inverter 307 is at the high level so that the transistors $Q_{31}$ and $Q_{32}$ are non-conducting. In this instance, since both inputs of the NOR circuit 304 are at the low level, the output of inverter 305 is at the low level so that the transistor $Q_{33}$ is conducting to clamp the output terminal at the power voltage $V_{cc}$, i.e., the low impedance state, as shown in FIG. 6(C).

Figure 5:
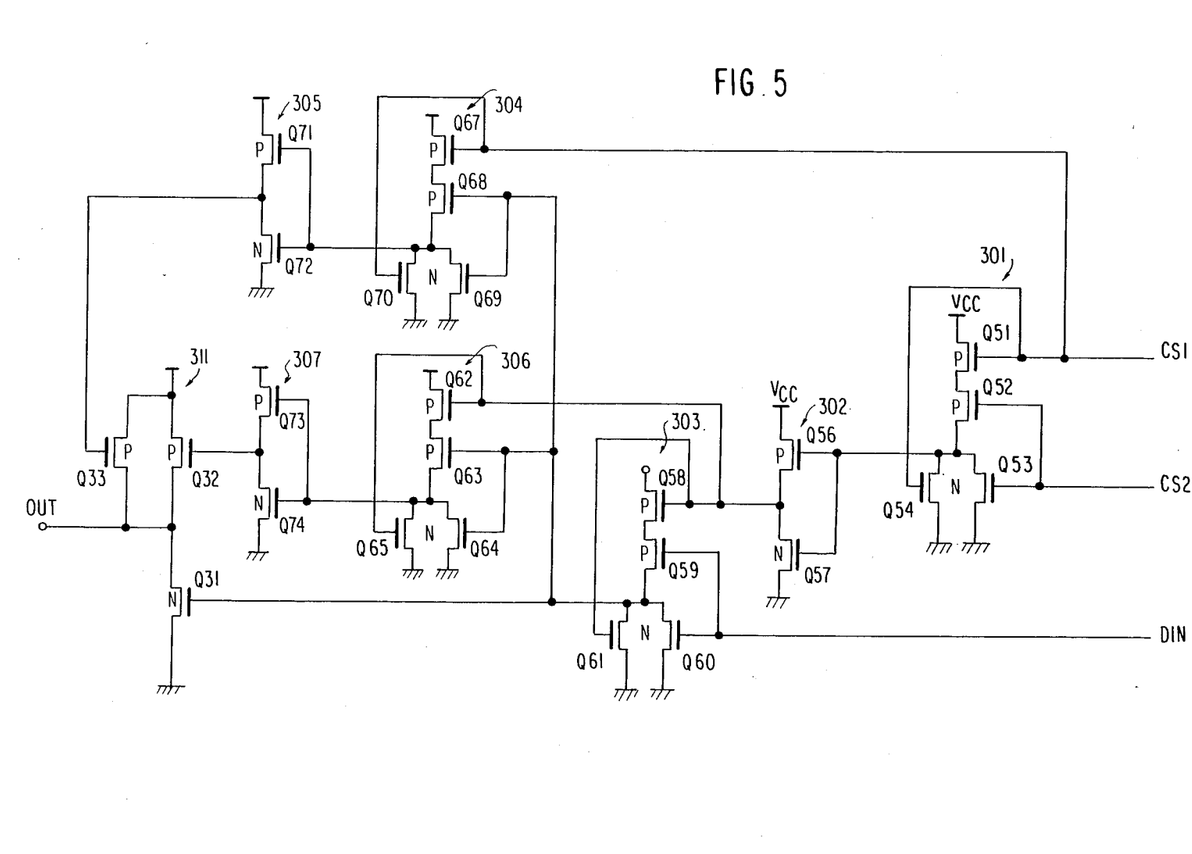
FIG. 5 is a schematic circuit diagram of the circuit shown in FIG. 4.

With reference to FIG. 5, the detailed circuit structure of the circuit shown in FIG. 4 will be explained. The NOR circuit 301 is composed of series connected P-channel field effect transistors $Q_{51}$ and $Q_{52}$ and parallel connected N-channel field effect transistors $Q_{53}$ and $Q_{54}$. The gates of the transistors $Q_{51}$ and $Q_{54}$ are commonly connected and constitute one of the input terminals of the circuit, while the gates of the transistors $Q_{52}$ and $Q_{53}$ are commonly connected and constitute the other input terminal. Other NOR circuits 303, 304, and 306 have the similar structure as illustrated.

The inverter 302 is composed of a P-channel field effect transistor $Q_{56}$ and an N-channel field effect transistor $Q_{57}$ connected in series between the power voltage Vcc and ground potential. The transistor gates are commonly connected and constitute the input terminal of the inverter. Other inverters 305 and 307 have the same circuit structure as the inverter 302.

Figure 7:
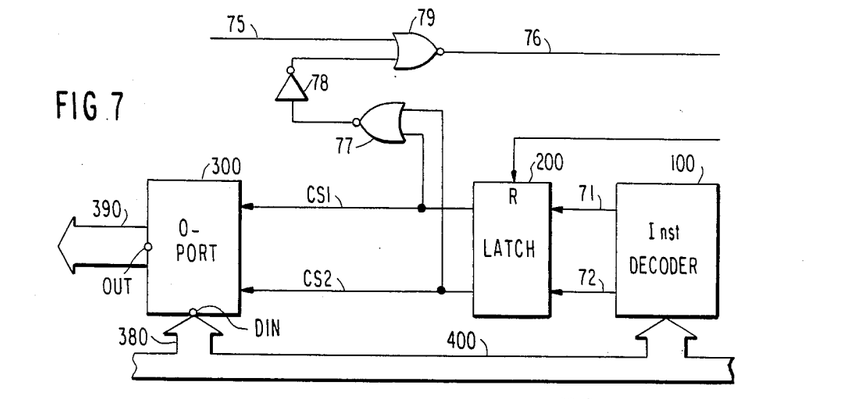
FIG. 7 is a block diagram of the data processing system according to the present invention.

Next, with reference to FIG. 7, an example of the major part of the data processing system according to the present invention will be explained. The output section 300 is the output circuit composed of the transistors $Q_{31}$ to $Q_{33}$ and the control circuit 30 shown in FIGS. 3, 4 and 5.

An instruction decoder 100 receives data from an internal bus 400 and generates selectively a first stop instruction signal 71 and a second stop instruction signal 72. The first and second stop instruction signals 71 and 72 are applied to a latch circuit 200 and operatively held by the latch circuit 200. The latch circuit 200 operatively holds the first and second stop signals 71 and 72, and outputs them as the control signals $CS_1$ and $CS_2$, respectively. The latch circuit is reset when a reset signal 80 is activated. The output section 300 receives the data signal via an input line 380 and outputs the data output signal from the output terminal OUT to an output line 390. A NOR circuit 77 receives the control signals $CS_1$ and $CS_2$ to detect the presence of either one of the control signals $CS_1$ and $CS_2$. The output of the NOR circuit 77 is applied to an inverter 78. The output of the inverter 78 is applied to one input terminal of a NOR circuit 79 receiving an external clock signal 75 from the outside. The NOR circuit 79 produces an internal clock signal 76 for controlling the circuits within the data processing system when the control signals $CS_1$ and $CS_2$ are not present.

The instruction decoder 100 produces the first or second stop instruction signal 71 or 72. The latch circuit 200 makes the control signal $CS_1$ for the first stop instruction signal 71 and the control signal $CS_2$ for the second stop instruction signal 72 in accordance with the activation of the first or second stop instruction signal 71 or 72. The control signals $CS_1$ and $CS_2$ remain active until the latch circuit 200 is reset by the reset signal 80. When the control signal $CS_1$ or $CS_2$ becomes active, the output of the NOR circuit 77 is low while the output of the inverter 78 is high. Even when the external clock 75 is supplied, the output of the NOR circuit 79 is always low, that is, the internal clock 76 is stopped, thereby attaining the standby mode.

When the section 300 receives the control signal $CS_1$ or $CS_2$ the output is brought to either a high impedance or a high voltage level. During normal operation, the output section 300 receives the data from the internal bus 400 through the line 380 and delivers the data from the line 390.

Here, selection of the high impedance state and the clamped level (e.g., high level) state in the standby mode is controlled by instruction applied to the instruction decoder 100. For example, in the case where a peripheral circuit having a low input impedance such as a TTL circuit is connected to the output terminal OUT, the instruction to the instruction decoder 100 is adapted to include such command that the decoder 100 produces the stop instruction signal 71 thereby to introduce the standby mode without generating the stop instruction signal 72. On the other hand, in the case where a circuit having a large input impedance, such as a CMOS type circuit, is connected as the peripheral circuit, the instruction to the decoder 100 is adapted to include such command that the decoder 100 produces the stop instructions signal 71.

Figure 8:
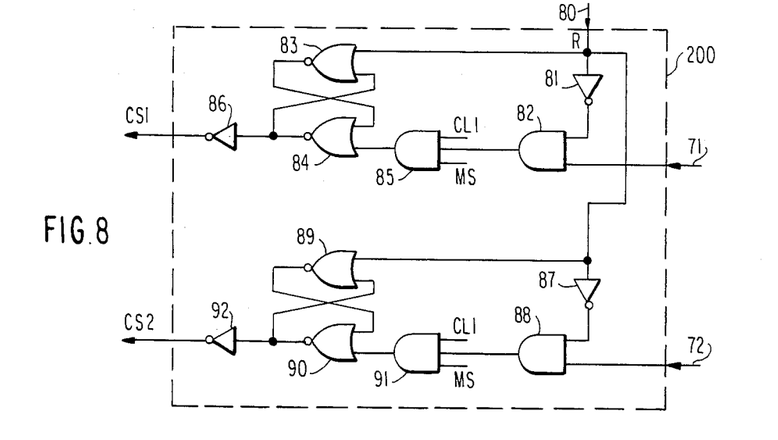
FIG. 8 is a block diagram of the latch circuit employed in FIG. 7.

With reference to FIG. 8, an example of the latch circuit 200 will be explained.

The latch circuit 200 is basically composed of two bistable circuits for operatively holding the signals 71 and 72. The bistable circuit for the signal 71 includes a flip-flop circuit composed of NOR circuits 83 and 84, inverters 81 and 86, and AND gates 82 and 85. The AND gate 82 receives the signal 71 and the inverted reset signal through the inverter 81. The AND gate 85 synchronizes the output of the AND gate 82 with an internal clock CL₁ and a certain timing signal MS. Therefore, the signal 71 is held by the flip-flop (83, 84) when the reset signal 80 is not active and both the internal clock CL₁ and the timing signal MS are present.

The other bistable circuit for holding the signal 72 is composed of NOR gates 89 and 90, AND gates 88 and 91, and inverters 87 and 92 in a similar manner.

As described above, according to the present invention, two kinds of output states are provided to the data output terminal OUT in the standby mode. Accordingly, it becomes possible to set the output condition of the output terminal in accordance with the peripheral system to be connected to the output terminal of the data processing system.

The explanation of the present invention has been made by way of specific embodiments. However, it is apparent that the present invention is not limited to the described embodiments.

We claim:

1. An output circuit comprising a first field effect transistor coupled between a first voltage terminal and an output terminal, a second field effect transistor coupled between said output terminal and a second voltage terminal, a third field effect transistor coupled between said output terminal and said first voltage terminal, a conductive resistance of said third transistor being larger than that of said first transistor, a first terminal receiving a first control signal, a second terminal receiving a second control signal independent of said first control signal, a third terminal receiving a data signal, first control means coupled to said first and second terminals for generating a detection signal at its output when at least one of said first and second control signals is present, second control means coupled to said third terminal and the output of said first means for generating a gated signal in accordance with said data signal when said detection signal is not present, means coupled to said second transistor and said second control means for controlling said second transistor in response to said gated signal, third control means coupled to said first transistor and receiving said gated signal and said detection signal for controlling said first transistor in accordance with said gated signal when said detection signal is not present, and fourth control means coupled to said third transistor and receiving said gated signal and said first control signal for making only said third transistor conducting with said first and second transistors nonconducting when said second control signal is present while said first control signal is not present, wherein said output terminal is set at a high impedance state when said first control signal is present, and set at said predetermined voltage through only said third transistor irrespective of the state of said data signal when said second control signal is present and said first control signal is not present.

2. The output circuit according to claim 1, in which said second transistor is of a first conductivity type and said first and third transistors are of a second channel conductivity type.

3. The output circuit according to claim 2, in which said first control means includes a first NOR circuit receiving said first and second control signals.

4. The output circuit according to claim 3, in which said second control means includes a second NOR circuit receiving said data signal and the inverted signal of the output of said first NOR circuit.

5. The output circuit according to claim 4, in which said third control means includes a third NOR circuit receiving said gated signal and said inverted signal.

6. The output circuit according to claim 5, in which said fourth control means includes a fourth NOR circuit receiving said gated signal and said first control signal.

7. An output circuit comprising a first field effect transistor coupled between a first voltage terminal and an output terminal, a second field effect transistor coupled between said output terminal and a second voltage terminal, a third field effect transistor coupled between said first voltage terminal and said output terminal, a conductive resistance of said third transistor being larger than that of said first transistor, a first terminal receiving a first control signal, a second terminal receiving a second control signal independent of said first control signal, a third terminal receiving a data signal, a first means coupled to said first to third terminals and said first and second transistors for making either one of said first and second transistors conducting and the other of said first and second transistors non-conducting in accordance with said data signal when said first and second signals indicate a normal operation mode, a second means coupled to said first and second terminals, said first and second transistors and said first means for making both of said first and second transistors nonconducting when said first and second control signals indicate a first standby mode, and a third means coupled to said first terminal and said third transistor for selectively making said third transistor conducting only when said first and second control signals indicate a second standby mode, whereby said output terminal is selectively provided with a high output impedance or with a clamped output voltage of a level near that of said first voltage terminal through only said third transistor in accordance with said first and second signals irrespective of the state of said data signal.

8. An output circuit comprising a first field effect transistor of a first conductivity type coupled between a first voltage terminal and an output terminal, a second field effect transistor of a second conductivity type coupled between said output terminal and a second voltage terminal, a third field effect transistor of said first conductivity type coupled between said output terminal and said first voltage terminal, a conductive resistance of said third transistor being larger than that of said first transistor, a first terminal receiving a first control signal, a second terminal receiving a second control signal independent of said first control signal, a third terminal receiving a data signal, first control means coupled to said first and second terminals for generating a detection signal at its output when at least one of said first and second control signals is present, said first control means including a first NOR circuit receiving said first and second control signals, second control means coupled to said third terminal and the output of said first means for generating a gated signal in accordance with said data signal when said detection signal is not present, means coupled to said second transistor and said second control means for controlling said second transistor in response to said gated signal, third control means coupled to said first transistor and receiving said gated signal and said detection signal for controlling said first transistor in accordance with said gated signal when said detection signal is not present, and fourth control means coupled to said third transistor and receiving said gated signal and said first control signal for making only said third transistor conducting with said first and second transistors non-conducting irrespective of said data signal when said second control signal is present, wherein said output terminal is set at a high impedance state when said first control signal is present, and set at said predetermined voltage through only said third transistor when said second control signal is present.

9. The output circuit according to claim 8, in which said second control means includes a second NOR circuit receiving said data signal and the inverted signal of the output of said first NOR circuit.

10. The output circuit according to claim 8, in which said third control means includes a third NOR circuit receiving said gated signal and said inverted signal.

11. The output circuit according to claim 8, in which said fourth control means includes a fourth NOR circuit receiving said gated signal and said first control signal.

12. An output circuit comprising a first transistor of a first conductivity type coupled between a first voltage terminal and an output terminal, a second transistor of a second conductivity type coupled between said output terminal and a second voltage terminal, a third transistor of said first conductivity type coupled between said first voltage terminal and said output terminal, a conductive resistance of said third transistor being larger than that of said first transistor, a first terminal receiving a first control signal, a second terminal receiving a second control signal independent of said first control signal, a third terminal receiving a data signal, a first NOR circuit receiving said first and second control signals, a second NOR circuit receiving said data signal and an an inverted signal of an output of said first NOR circuit, means for connecting an output of said second NOR circuit to a control electrode of said second transistor, a third NOR circuit receiving the inverted signal of the output of said first NOR circuit and the output of said second NOR circuit, means for applying an inverted signal of the output of said third NOR circuit to a control electrode of said first transistor, a fourth NOR circuit receiving said first control signal and the output of said second NOR circuit, and means for applying an inverted signal of the output of said fourth NOR circuit to a control electrode of said third transistor.

13. The output circuit according to claim 12, wherein said first conductivity type is P channel and said second conductivity type is N channel.

* * * * *

UNITED STATES PATENT AND TRADEMARK OFFICE
CERTIFICATE OF CORRECTION

PATENT NO. : 4,728,822
DATED : March 1, 1988
INVENTOR(S) : Kusaka et al

It is certified that error appears in the above-identified patent and that said Letters Patent is hereby corrected as shown below:

COLUMN 2, LINE 39  Delete "effect transistors" and insert --generated within--;

COLUMN 6, LINE 60  Delete "71" and insert --72 without generation of the stop instructions signal 71--.

Signed and Sealed this

Twenty-fifth Day of October, 1988

Attest:

DONALD J. QUIGG

*Attesting Officer*     *Commissioner of Patents and Trademarks*